(12) United States Patent
Xiang et al.

(10) Patent No.: US 10,692,819 B2
(45) Date of Patent: Jun. 23, 2020

(54) SEMICONDUCTOR STRUCTURE AND METHOD FOR MANUFACTURING SEMICONDUCTOR STRUCTURE

(71) Applicant: ENKRIS SEMICONDUCTOR, INC., Suzhou (CN)

(72) Inventors: Peng Xiang, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 15 days.

(21) Appl. No.: 16/184,998

(22) Filed: Nov. 8, 2018

(65) Prior Publication Data

US 2019/0081010 A1 Mar. 14, 2019

Related U.S. Application Data

(63) Continuation of application No. PCT/CN2017/081658, filed on Apr. 24, 2017.

(51) Int. Cl.
*H01L 21/02* (2006.01)
*H01L 29/161* (2006.01)
(Continued)

(52) U.S. Cl.
CPC ........ *H01L 23/562* (2013.01); *H01L 21/0242* (2013.01); *H01L 21/0245* (2013.01); *H01L 21/0251* (2013.01); *H01L 21/0254* (2013.01); *H01L 21/02378* (2013.01); *H01L 21/02381* (2013.01); *H01L 21/02389* (2013.01); *H01L 21/02452* (2013.01); *H01L 21/02458* (2013.01); *H01L 21/02477* (2013.01);
(Continued)

(58) Field of Classification Search
CPC ..... H01L 21/0251; H01L 33/12; H01L 33/32; H01L 29/778–7789; H01L 29/22; H01L 29/20; H01L 29/2003; H01L 29/201; H01L 29/1608; H01L 29/161; H01L 21/02378; H01L 21/02373; H01L 21/02389; H01L 21/02441; H01L 21/0245; H01L 21/02447; H01L 21/02452; H01L 21/02455; H01L 21/02458
See application file for complete search history.

(56) References Cited

U.S. PATENT DOCUMENTS

2003/0134491 A1* 7/2003 Yamagata ............... C30B 25/02
438/478
2014/0175515 A1* 6/2014 Then ..................... H01L 29/772
257/194

* cited by examiner

*Primary Examiner* — Grant S Withers
(74) *Attorney, Agent, or Firm* — Flener IP & Business Law; Zareefa B. Flener

(57) ABSTRACT

The present invention discloses a semiconductor structure and a method for manufacturing the semiconductor structure. The semiconductor structure includes: a substrate; and at least one composition adjusting layer disposed above the substrate; wherein each of the at least one composition adjusting layer is made of a semiconductor compound, the semiconductor compound at least comprises a first element and a second element, and an atomic number of the first element is less than an atomic number of the second element, wherein in each of the at least one composition adjusting layer, along an epitaxial direction of the substrate, an atomic percentage of the first element in a compound composition is gradually decreased at first and then gradually increased, a thickness of a gradual decrease section is greater than a thickness of a gradual increase section.

15 Claims, 3 Drawing Sheets

(51) Int. Cl.
  *H01L 29/20* (2006.01)
  *H01L 23/00* (2006.01)
  *H01L 33/12* (2010.01)
  *H01L 33/32* (2010.01)
  *H01L 33/34* (2010.01)
(52) U.S. Cl.
  CPC .......... *H01L 29/2003* (2013.01); *H01L 33/12* (2013.01); *H01L 33/32* (2013.01); *H01L 33/34* (2013.01)

SEMICONDUCTOR STRUCTURE AND METHOD FOR MANUFACTURING SEMICONDUCTOR STRUCTURE

CROSS-REFERENCE TO RELATED APPLICATIONS

This application is Continuation Application of PCT application Serial No. PCT/CN2017/081658, filed on Apr. 24, 2017, the entire contents of which are incorporated herein by reference for all purposes.

TECHNICAL FIELD

The present invention relates to semiconductor technologies, particularly to a semiconductor structure and a method for manufacturing a semiconductor structure.

BACKGROUND

Semiconductor compounds are widely used in the preparation of various light-emitting components and electronic device components because of their excellent semiconductor properties. A component action layer made of semiconductor compounds is generally prepared by epitaxial growth on a substrate. However, the substrate and the semiconductor compounds epitaxially grown on the substrate may have different thermal expansion coefficients and lattice constants, thus a great thermal mismatch and lattice mismatch between the substrate and the epitaxially grown structure may be caused. Thus, when a semiconductor compound structure is epitaxially grown on the substrate, a large tensile strain is generated in the process of cooling from a high temperature, so that the epitaxially grown structure has problems of cracking easily, large warping, and large dislocation density, etc.

SUMMARY

In view of this, the present invention provides a semiconductor structure and a method for manufacturing a semiconductor structure to solve the problems of cracking easily, large warping and large dislocation density existed in a semiconductor compound structure, which is epitaxially grown on a substrate, in the prior art.

A semiconductor structure according to an embodiment of the present invention, includes: a substrate; and at least one composition adjusting layer disposed above the substrate; wherein each of the at least one composition adjusting layer is made of a semiconductor compound, the semiconductor compound at least includes a first element and a second element, and an atomic number of the first element is less than an atomic number of the second element; wherein in each of the at least one composition adjusting layer, along an epitaxial direction of the substrate, an atomic percentage of the first element in a compound composition is gradually decreased at first and then gradually increased, a thickness of a gradual decrease section is greater than a thickness of a gradual increase section, and the atomic percentage at the end of the gradual increase section is less than or equal to the atomic percentage at the beginning of the gradual decrease section.

In an embodiment of the present invention, the semiconductor compound is an IV-IV group compound, and the first element and the second element are two kinds of IV group elements respectively.

In an embodiment of the present invention, the semiconductor compound is a binary IV-IV group compound, and the first element and the second element are Si and Ge respectively.

In an embodiment of the present invention, the semiconductor compound further includes: a third element; wherein the semiconductor compound is an IV-IV group compound, and the first element, the second element and the third element are three kinds of IV group elements respectively; or, the semiconductor compound is an III-V group compound, the first element and the second element are two kinds of III group elements respectively, and the third element is a V group element; or, the semiconductor compound is an II-VI group compound, the first element and the second element are two kinds of II group elements respectively, and the third element is a VI group element.

In an embodiment of the present invention, the semiconductor compound is a ternary IV-IV group compound, and the first element, the second element and the third element are Si, Ge, and Sn respectively; or the semiconductor compound is a ternary III-V group compound, the first element and the second element are Al and Ga respectively, and the third element is N; or the semiconductor compound is a ternary II-VI group compound, the first element and the second element are Zn and Cd respectively, and the third element is Se.

In an embodiment of the present invention, the at least one composition adjusting layer is sequentially stacked along the epitaxial direction of the substrate.

In an embodiment of the present invention, in the at least one composition adjusting layer, an average content of the first element in a nth composition adjusting layer along the epitaxial direction of the substrate is greater than an average content of the first element in a (n+1)th composition adjusting layer.

In an embodiment of the present invention, the atomic percentage of the first element at the beginning of the gradual decrease section of the nth composition adjusting layer is greater than the atomic percentage of the first element at the beginning of the gradual decrease section of the (n+1)th composition adjusting layer.

In an embodiment of the present invention, a total thickness of the nth composition adjusting layer is less than a total thickness of the (n+1)th composition adjusting layer.

In an embodiment of the present invention, in the composition adjusting layer, the atomic percentage of the first element in the compound composition is gradually decreased from an initial value $x_{na}$ to $x_{nb}$ along the epitaxial direction of the substrate at first, then gradually increased to $x_{nc}$, and $x_c = x_a$.

In an embodiment of the present invention, in the composition adjusting layer, $x_c = x_a = 0.8$, $x_b = 0.2$.

In an embodiment of the present invention, in the composition adjusting layer, changing of the atomic percentage of the first element in the compound composition further includes at least one constant value section along the epitaxial direction of the substrate.

In an embodiment of the present invention, in a nth composition adjusting layer along the epitaxial direction of the substrate, the atomic percentage of the first element in the compound composition is gradually decreased from an initial value $x_{na}$ to $x_{nb}$ along the epitaxial direction of the substrate at first, then gradually increased to $x_{nc}$, and the at least one constant value section includes at least one of the following: an $x_{na}$ constant value section, an $x_{nb}$ constant value section and an $x_{nc}$ constant value section.

In an embodiment of the present invention, the gradual decrease section includes any one or any combination of following sub-sections: at least one decrease sub-section, at least one constant value sub-section and at least one increase sub-section; and/or, the gradual increase section includes any one or any combination of following sub-sections: at least one decrease sub-section, at least one constant value sub-section and at least one increase sub-section.

In an embodiment of the present invention, atomic percentages of the gradual decrease section and/or the gradual increase section are changed gradually in any one or any combination of following ways: a linear gradient, a curved gradient and a step gradient.

In an embodiment of the present invention, a ratio of the thickness of the gradual decrease section to the thickness of the gradual increase section is 3:1.

In an embodiment of the present invention, the thickness of the gradual decrease section is 180 nm, and the thickness of the gradual increase section is 60 nm; or the thickness of the gradual decrease section is 120 nm, and the thickness of the gradual increase section is 40 nm.

In an embodiment of the present invention, the semiconductor structure further includes: a nucleation layer disposed between the substrate and a first composition adjusting layer along the epitaxial direction.

In an embodiment of the present invention, the nucleation layer includes any one or any combination of AlN and AlGaN.

In an embodiment of the present invention, the semiconductor structure further includes: a component action layer disposed over the at least one composition adjusting layer.

In an embodiment of the present invention, the component action layer includes any one or any combination of GaN, AlGaN, and AlInGaN.

In an embodiment of the present invention, the substrate includes any one or any combination of Si, SiC, GaN, and $Al_2O_3$.

A method for manufacturing a semiconductor structure according to an embodiment of the present invention, includes: preparing at least one composition adjusting layer; wherein each of the at least one composition adjusting layer is made of a semiconductor compound, the semiconductor compound at least includes a first element and a second element, and an atomic number of the first element is less than an atomic number of the second element; wherein in each of the at least one composition adjusting layer, along an epitaxial direction of the substrate, an atomic percentage of the first element in a compound composition is gradually decreased at first and then gradually increased, a thickness of a gradual decrease section is greater than a thickness of a gradual increase section, and the atomic percentage at the end of the gradual increase section is less than or equal to the atomic percentage at the beginning of the gradual decrease section.

According to a semiconductor structure and a method for manufacturing the semiconductor structure provided by the embodiments of the present invention, by arranging at least one composition adjusting layer, in which the atomic percentage of the first element is decreased firstly and then increased, above the substrate, a stress filed with periodic changes in the stress direction is constructed in the epitaxial structure above the substrate, so that bending annihilation of dislocations can be realized to reduce dislocations in the epitaxial structure. At the same time, due to the gradual decrease of the atomic percentage of the first element with a smaller atomic number, a compressive stress, which can cause a deformation of bulging from the middle to the periphery, is induced; and since the thickness of the gradual decrease section is greater than the thickness of the gradual increase section, the compressive stress, which can cause a deformation of bulging from the middle to the periphery, is still induced in the whole composition adjusting layer. Thus the tensile stress, which can cause a deformation of sinking from the periphery to the middle, induced during a cooling process of the whole epitaxial structure can be effectively balanced by the compressive stress, so that the whole epitaxial structure is not easily cracked and warped.

DETAILED DESCRIPTION

In order to make the purpose, technical means and advantages of the present invention clear, the present invention will be further described in detail in conjunction with the accompanying drawings.

Figure 1:
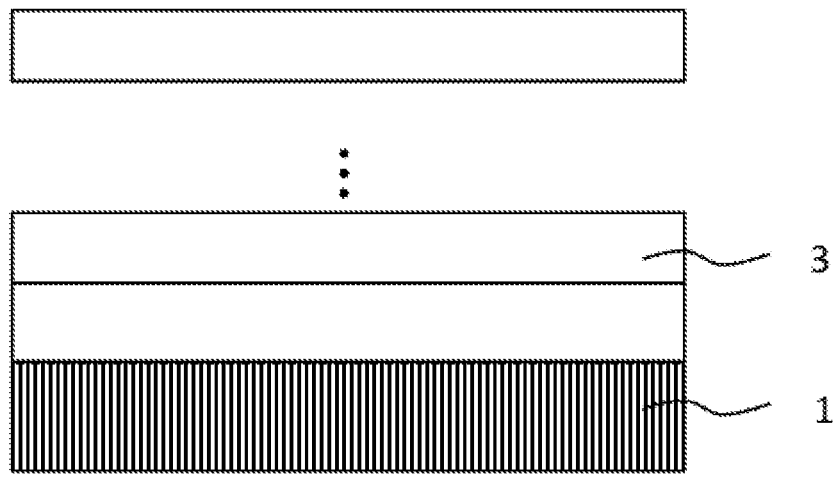
FIG. 1 is a schematic diagram illustrating a semiconductor structure according to an embodiment of the present invention.

FIG. 1 is a schematic diagram illustrating a semiconductor structure according to an embodiment of the present invention, as shown in FIG. 1, the semiconductor structure includes: a substrate 1, and at least one composition adjusting layer 3 disposed above the substrate 1.

Each of the at least one composition adjusting layer 3 is made of a semiconductor compound, the semiconductor compound at least includes a first element and a second element, and an atomic number of the first element is less than an atomic number of the second element; wherein in each of the at least one composition adjusting layer, along an epitaxial direction of the substrate, an atomic percentage of the first element in a compound composition is gradually decreased at first and then gradually increased, a thickness of a gradual decrease section is greater than a thickness of a gradual increase section, and the atomic percentage at the end of the gradual increase section is less than or equal to the atomic percentage at the beginning of the gradual decrease section.

It should be understood that the terms "gradual decrease" and "gradual increase" described above are used to indicate an overall change trend of the atomic percentage of the first element. In fact, the overall change trend of the "gradual decrease" or "gradual increase" may include a variety of specific variations (for example, decreasing along the epitaxial direction for a period firstly, then maintaining a constant value for a period, then increasing for a period and at last continuing to decrease for a period to accomplish the "gradual decrease"). The specific variations included in the gradual decrease section or the gradual increase section cannot be used to limit the protection scope of the present invention.

According to the structure provided by the embodiments of the present invention, by arranging at least one composition adjusting layer 3, in which the atomic percentage of the first element is decreased firstly and then increased, above the substrate 1, a stress filed with periodic changes in the stress direction is constructed in the epitaxial structure above the substrate 1, so that bending annihilation of dislocations can be realized to reduce dislocations in the epitaxial structure. At the same time, due to the gradual decrease of the atomic percentage of the first element with a smaller atomic number, a compressive stress, which can cause a deformation of bulging from the middle to the periphery, is induced; and since the thickness of the gradual decrease section is greater than the thickness of the gradual increase section, the compressive stress, which can cause a deformation of bulging from the middle to the periphery, is still induced in the whole composition adjusting layer. Thus the tensile stress, which can cause a deformation of sinking from the periphery to the middle, induced during a cooling process of the whole epitaxial structure can be effectively balanced by the compressive stress, so that the whole epitaxial structure is not easily cracked and warped.

Figure 2:
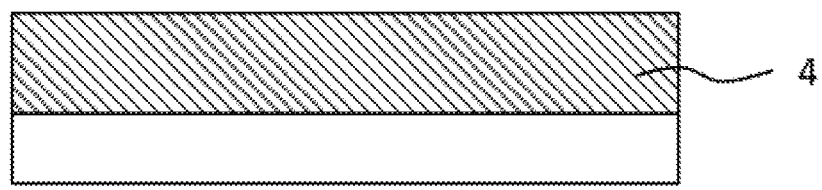
FIG. 2 is a schematic diagram illustrating a semiconductor structure according to another embodiment of the present invention.
Figure 2:
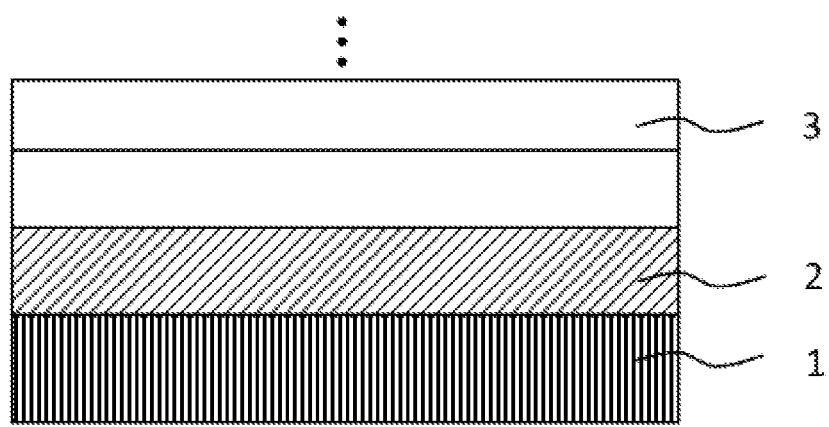

In an embodiment of the present invention, as shown in FIG. 2, in order to reduce the dislocation density and the defect density and prevent remelting, the semiconductor structure may further include a nucleation layer 2 disposed between the substrate 1 and a first composition adjusting layer 3 along the epitaxial direction. In another embodiment of the present invention, in order to form a complete electronic device structure, the semiconductor structure may further include a component action layer 4 disposed over the at least one composition adjusting layer 3. An active region may be continuously stacked on the component action layer 4, and the active region may be selected from a light emitting diode including indium gallium nitrogen/gallium nitrogen multiple quantum well structure and p-type nitride, a high electron mobility transistor made of aluminum gallium nitride/gallium nitride heterostructure, a high electron mobility transistor made of aluminum gallium indium nitride/gallium nitride heterostructure, a high mobility triode made of aluminum nitride/gallium nitride heterostructure, a MOSFET of gallium nitride, an UV-LED, a photodetector, a hydrogen generator or a solar cell, etc.

In an embodiment of the present invention, the nucleation layer 2 may include any one or any combination of AlN and AlGaN. The component action layer 4 may include any one or any combination of GaN, AlGaN, and AlInGaN. The substrate 1 may include any one or any combination of Si, SiC, GaN, and $Al_2O_3$. However, the materials of the nucleation layer 2, the component action layer 4 and the substrate 1 may be adjusted according to the needs of the actual application scenario, which cannot be used to limit the protection scope of the present invention.

In an embodiment of the present invention, the material of the composition adjusting layer 3 may be specifically an III-V group compound, which at least includes two kinds of III group elements and one V group element, that is, the first element and the second element described above are two kinds of III group elements, and the third element is a V group element. To facilitate the explanation of the technical scheme, the two kinds of III group elements are respectively marked as $III^1$ and $III^2$, and the V group element is marked as $V^1$. The atomic number of $III^2$ is greater than the atomic number of $III^1$. But it should be understood that the marks $III^1$, $III^2$, and $V^1$ are only used to more clearly explain the technical scheme of the present invention, and are not intended to limit the protection scope of the present invention.

In an example, the III group element $III^1$ is Al, the III group element $III^2$ is Ga and the V group element $V^1$ is N. In this case, when the material of the composition adjusting layer 3 is a ternary III-V group compound, the composition of the composition adjusting layer 3 can be represented as $Al_xGa_{1-x}N$; and in the $Al_xGa_{1-x}N$, the total number of atoms of the III group element: the total number of atoms of the V group element=1:1. In a nth composition adjusting layer 3 along the epitaxial direction of the substrate 1 in the at least one composition adjusting layer 3, the atomic percentage x of Al in the compound composition is gradually decreased from an initial value $x_{na}$ to $x_{nb}$ along the epitaxial direction of the substrate 1 at first, then gradually increased to $x_{nc}$, the thickness of the gradual decrease section is greater than the thickness of the gradual increase section, $0 \le x \le 1$, $x_{nc} \le x_{na}$, and n is an integer greater than or equal to 1.

According to the structure provided by the embodiments of the present invention, by arranging at least one composition adjusting layer 3, in which the atomic percentage of Al is decreased firstly and then increased, above the substrate 1, a stress filed with periodic changes in the stress direction is constructed in the epitaxial structure above the substrate 1, so that bending annihilation of dislocations can be realized to reduce dislocations in the epitaxial structure.

At the same time, since the atomic number of Ga is larger than the atomic number of Al, when the atomic percentage x of Al is decreased, the atomic percentage 1−x of Ga will be increased, thus a compressive stress, which can cause a deformation of bulging from the middle to the periphery, is induced in the gradual decrease section of x in $Al_xGa_{1-x}N$. Since the thickness of the gradual decrease section of x is larger than the thickness of the gradual increase section of x, the compressive stress, which can cause a deformation of bulging from the middle to the periphery, is still induced in the whole composition adjusting layer 3 to balance the tensile stress induced during the cooling process of the whole epitaxial structure.

It should be understood that, although in the above description of the embodiments, the first element and the second element of the semiconductor compound constituting the composition adjusting layer 3 are defined as III group elements, and the third element is defined as a V group element, other semiconductor compounds other than III-V group compounds may also be specifically selected to constitute the composition adjusting layer 3. The specific composition of the semiconductor compound cannot be used to limit the protection scope of the present invention.

It should also be understood that, although $III^1$ is defined as Al, $III^2$ is defined as Ga, and $V^1$ is defined as N in the description of the above embodiments, other III group elements and V group elements may also be included in the composition adjusting layer 3, and the specific selection of the III group element and the V group element cannot be used to limit the protection scope of the present invention. At the same time, the material of the composition adjusting layer 3 may also be an III-V group compound including more than three elements, and the number of the III group element and the number of V group element included in the composition adjusting layer 3 also cannot be used to limit the protection scope of the present invention.

In an embodiment of the present invention, the material of the composition adjusting layer 3 may also be an IV-IV group compound specifically, and the first element and the second element are two kinds of IV group elements respectively. When the IV-IV group compound is a binary IV-IV group compound, the first element and the second element may be Si and Ge respectively. When the IV-IV group compound is a ternary IV-IV group compound, the semiconductor compound of the composition adjusting layer 3 further needs to include a third element. The first element, the second element and the third element may be three kinds of IV group elements respectively, such as Si, Ge and Sn. However, the specific selection and the number of the IV group elements included in the IV-IV group compound cannot be used to limit the protection scope of the present invention.

In another embodiment of the present invention, the material of the composition adjusting layer 3 may also be an II-VI group compound specifically, the first element and the second element are two kinds of II group elements respectively, and the third element is a VI group element. When the II-VI group compound is a ternary compound, the first element and the second element may be Zn and Cd respectively, and the third element may be Se. However, the specific selection and the number of the II group element and the VI group element included in the II-VI group compound cannot be used to limit the protection scope of the present invention.

However, in order to facilitate the explanation of the technical scheme of the present invention, the ternary III-V compound $Al_xGa_{1-x}N$ will be used as an example to explain the technical scheme of the present invention. In the following description of the embodiments of the present invention, $III^1$ and Al, $III^2$ and Ga, and $V^1$ and N will not be distinguished respectively.

In an embodiment of the present invention, as shown in FIG. 1, the at least one composition adjusting layer 3 is sequentially stacked along the epitaxial direction of the substrate 1. However, it should be understood that the at least one composition adjusting layer 3 may not be stacked in sequence, but interposed with other semiconductor structures (for example, a semiconductor superlattice buffer structure). In addition, the specific number of the at least one composition adjusting layer 3 may also be adjusted according to the needs of the actual application scenario. Therefore, the arrangement structure and the number of the composition adjusting layer 3 above the substrate 1 also cannot be used to limit the protection scope of the present invention.

In an embodiment of the present invention, in the at least one composition adjusting layer 3, an average content of Al in a nth composition adjusting layer 3 along the epitaxial direction of the substrate 1 may be greater than an average content of Al in a (n+1)th composition adjusting layer 3. In this way, in two composition adjusting layers 3 adjacent to each other, the average content of Al in the composition adjusting layer 3 located below is greater than the average content of Al in the composition adjusting layer 3 located above, so that the composition adjusting layer 3 located above is subjected to a compressive stress, which can cause a deformation of bulging from the middle to the periphery, transmitted by the composition adjusting layer 3 located below. Thus, the compressive stress is transmitted between each two composition adjusting layers 3 adjacent to each other in the at least one composition adjusting layer 3, thereby the tensile stress induced during the cooling process of the whole epitaxial structure may be further balanced, and the preparation quality of the whole epitaxial structure may be improved. At the same time, the higher the content of Al is, the larger the dislocation density is, and the compressive stress is released more easily. Since the compressive stress released cannot be used to balance the tensile stress, the average content of Al may be decreased along the epitaxial direction, which can make the compressive stress release less easily in the composition adjusting layer 3 located above than the composition adjusting layer 3 located below. In this case, the compressive stress used to balance the tensile stress can be larger in the composition adjusting layer 3 located above, and the ability of balancing the tensile stress can be further improved.

In a further embodiment, the atomic percentage of Al at the beginning of the gradual decrease section in the nth composition adjusting layer 3 is greater than the atomic percentage of Al at the beginning of the gradual decrease section in the (n+1)th composition adjusting layer 3, that is, the initial value $x_{na}$ of x of the nth composition adjusting layer 3 may be greater than the initial value $x_{n=1a}$ of x of the (n+1)th composition adjusting layer 3. Since neither $x_{nb}$ nor $x_{nc}$ is greater than $x_{na}$, and neither $x_{n+1b}$ nor $x_{n+1c}$ is greater than $x_{n+1a}$, the average content of Al in the nth composition adjusting layer 3 is inevitably greater than the average content of Al in the (n+1)th composition adjusting layer 3.

In an embodiment of the present invention, when the average content of Al in the nth composition adjusting layer 3 is greater than the average content of Al in the (n+1)th composition adjusting layer 3, a total thickness of the nth composition adjusting layer 3 may be less than a total thickness of the (n+1)th composition adjusting layer 3. Thus, the lower the average content of Al is, the thicker the composition adjusting layer 3 is, the dislocation density in the whole epitaxial structure can be further reduced, and the stress release can be reduced, thereby the preparation quality of the whole epitaxial structure can be further improved. In addition, since the higher the content of Al is, the slower the growth rate of the composition adjusting layer 3 is, by making the composition adjusting layer 3 with lower average content of Al thicker, it may be ensured that the overall growth time of all the composition adjusting layers can be reduced as much as possible, the average growth rate and production capacity can be improved, and the production costs may be reduced, based on the same stress balancing ability. It should be understood that the number and thickness of the composition adjusting layer 3, the specific values of $x_{na}$, $x_{nb}$ and $x_{nc}$, and the specific thicknesses of the gradual decrease section and the gradual increase section may be adjusted according to the needs of the actual application scenario. The specific values of the above variables cannot be used to limit the protection scope of the present invention.

Figure 3:
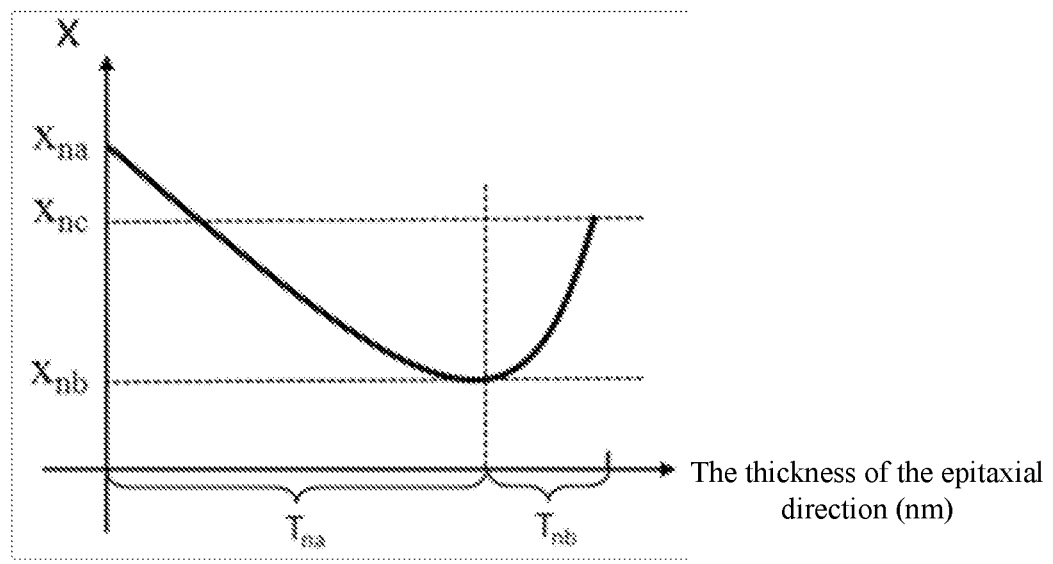
FIG. 3 is a schematic diagram illustrating a gradual change principle of an atomic percentage of the third group element $III^1$ of a nth composition adjusting layer in a semiconductor structure according to an embodiment of the present invention.

FIG. 3 is a schematic diagram illustrating a gradual change principle of an atomic percentage of the third group element $III^1$ of a nth composition adjusting layer 3 in a semiconductor structure according to an embodiment of the present invention. As shown in FIG. 3, in the gradual decrease section, the atomic percentage x is decreased from the initial value $x_{na}$ to $x_{nb}$ in a curved gradient, then increased from $x_{nb}$ to $x_{nc}$ in a curved gradation, and $x_{nc} < x_{na}$. Along the epitaxial direction of the substrate 1, the thickness $T_{na}$ of the gradual decrease section is greater than the thickness $T_{nb}$ of the gradual increase section.

Figure 4:
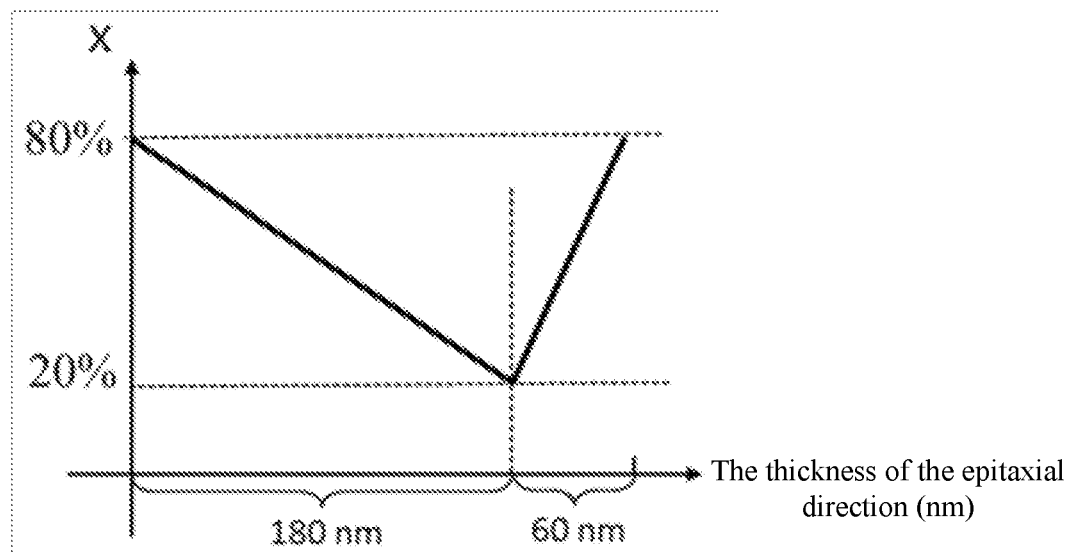
FIG. 4 is a schematic diagram illustrating a gradual change principle of an atomic percentage of the third group element $III^1$ of a nth composition adjusting layer in a semiconductor structure according to another embodiment of the present invention.

FIG. 4 is a schematic diagram illustrating a gradual change principle of an atomic percentage of the third group element III[1] of a nth composition adjusting layer 3 in a semiconductor structure according to another embodiment of the present invention.

The semiconductor structure includes: a Si substrate, a nucleation layer 2, 20 composition adjusting layers 3 ($Al_xGa_{1-x}N$ layer), and a nitride component action layer 4. As shown in FIG. 4, the atomic percentage x of Al in the nth composition adjusting layer 3 is linearly decreased from $x_{na}$=80% to $x_{nb}$=20% within the thickness of $T_{na}$, then linearly increased from 20% to $x_{nc}$=80% within the thickness of $T_{nb}$, and $T_{na}$ is greater than $T_{nb}$. The subsequent 19 composition adjusting layers 3 are all repeating the structure of the first composition adjusting layer 3. Since $x_{nc}$ is equal to $x_{na}$, the 20 composition adjusting layers 3 are continuous repeating structures of 20 cycles. In this case, by preparing the subsequent 19 composition adjusting layers 3 through metal vapor deposition, the continuous adjustment of the Al source supply can be achieved, which is advantageous to improve the preparation efficiency of the composition adjusting layer 3.

In an embodiment of the present invention, the ratio of $T_{na}$ to $T_{nb}$ is 3:1, for example, $T_{nb}$ is 60 nm when $T_{na}$ is 180 nm, and $T_{nb}$ is 40 nm when $T_{na}$ is 120 nm.

Figure 5:
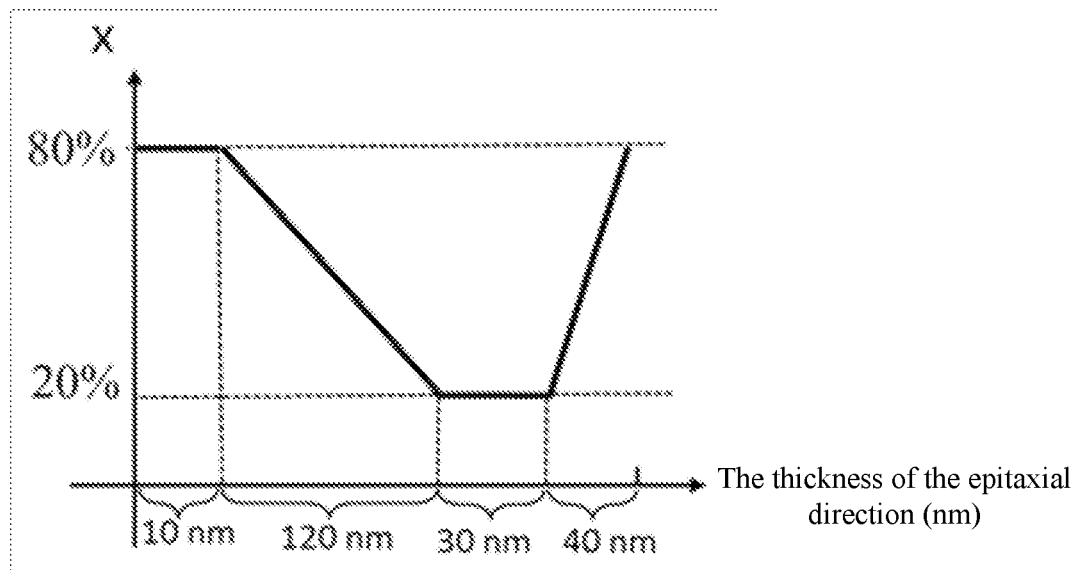
FIG. 5 is a schematic diagram illustrating a gradual change principle of an atomic percentage of the third group element $III^1$ of a nth composition adjusting layer in a semiconductor structure according to another embodiment of the present invention.

FIG. 5 is a schematic diagram illustrating a gradual change principle of an atomic percentage of the third group element III[1] of a nth composition adjusting layer 3 in a semiconductor structure according to another embodiment of the present invention.

The semiconductor structure includes: a Si substrate, a nucleation layer 2, 23 composition adjusting layers 3 ($Al_xGa_{1-x}N$ layer), and a nitride component action layer 4. As shown in FIG. 5, changing of the atomic percentage x of the nth composition adjusting layer 3 further includes two constant value sections along the epitaxial direction of the substrate 1. Specifically, the atomic percentage x of Al in the first composition adjusting layer 3 is maintained at $x_{na}$=80% within a thickness of 10 nm, then decreased to $x_{nb}$=20% within a thickness of 120 nm, then maintained at $x_{nb}$=20% within a thickness of 30 nm, and then increased to $x_{nc}$=80% within a thickness of 40 nm. By setting constant value sections in the changing of the atomic percentage x in the composition adjusting layer 3, the release of the compressive stress may be reduced, and the ability of the epitaxial structure to balance the tensile stress may be further improved.

It should be understood that in a composition adjusting layer 3, at least one constant value section may be included in the changing of the atomic percentage x, and the at least one constant value section may include at least one of the following: an $x_{na}$ constant value section, an $x_{nb}$ constant value section, and an $x_{nc}$ constant value section. The type and number of the constant value section cannot be used to limit the protection scope of the present invention.

In addition, it should also be understood that, in addition to the above-mentioned manners of the curved gradient and the linear gradient, atomic percentages of the gradual decrease section and/or the gradual increase section may be changed gradually in other ways, such as in a step gradient. The detail changing manner of the atomic percentages of the gradual decrease section and/or the gradual increase section cannot be used to limit the protection scope of the present invention.

Figure 6:
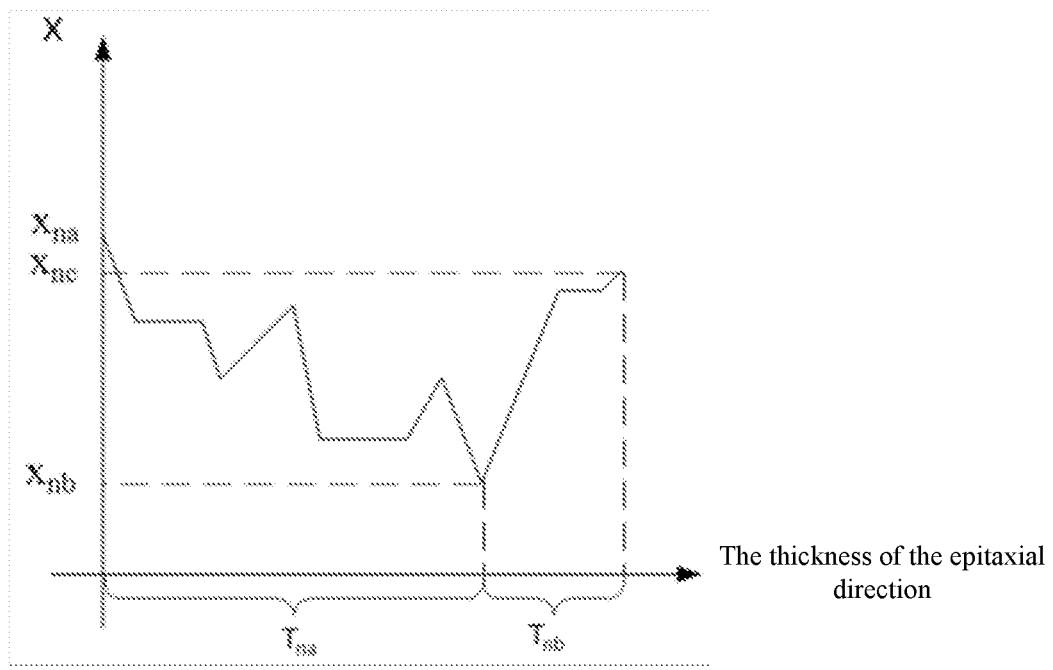
FIG. 6 is a schematic diagram illustrating a gradual change principle of an atomic percentage of the third group element $III^1$ of a nth composition adjusting layer in a semiconductor structure according to another embodiment of the present invention.

FIG. 6 is a schematic diagram illustrating a gradual change principle of an atomic percentage of the third group element III[1] of a nth composition adjusting layer in a semiconductor structure according to another embodiment of the present invention.

Different from the embodiment shown in FIG. 3 or FIG. 4, in the semiconductor structure shown in FIG. 6, the atomic percentage x of Al in the nth composition adjusting layer 3 is not decreased from $x_{na}$ to $x_{nb}$ in a continuous decrease manner within the thickness of $T_{na}$, and is not increased from $x_{nb}$ to $x_{nc}$ in a continuous increase manner within the thickness of $T_{nb}$. As shown in FIG. 6, the gradual decrease section of the atomic percentage x of Al includes four decrease sub-sections, two constant value sub-sections, and two increase sub-sections; and the gradual increase section of the atomic percentage x of Al includes two increase sub-sections and one constant value sub-section.

Although in the above embodiment, the gradual decrease section and the gradual increase section respectively include fixed sub-section combinations, it should be understood that the gradual decrease section of the atomic percentage x of the first element of the composition adjusting layer 3 in the compound composition may actually include any one or any combination of the following sub-sections: at least one decrease sub-section, at least one constant value sub-section and at least one increase sub-section; and/or, the gradual increase section may also include any one or any combination of following sub-sections: at least one decrease sub-section, at least a constant value sub-section and at least one increase sub-section. The type, the number and the specific combination manner of the sub-sections included in the gradual decrease section and the gradual increase section cannot be used to limit the protection scope of the present invention.

A method for manufacturing a semiconductor structure is also provided according to another embodiment of the present invention, and the method includes: preparing at least one composition adjusting layer 3 above a substrate 1; wherein each of the at least one composition adjusting layer is made of a semiconductor compound, the semiconductor compound at least includes a first element and a second element, and an atomic number of the first element is less than an atomic number of the second element; wherein in each of the at least one composition adjusting layer, along an epitaxial direction of the substrate, an atomic percentage of the first element in a compound composition is gradually decreased at first and then gradually increased, a thickness of a gradual decrease section is greater than a thickness of a gradual increase section, and the atomic percentage at the end of the gradual increase section is less than or equal to the atomic percentage at the beginning of the gradual decrease section.

In an embodiment of the present invention, the at least one composition adjusting layer 3 may be prepared by metal vapor deposition. However, it should be understood that the specific preparation method of the composition adjusting layer 3 may be adjusted according to a specific composition, and the specific preparation method of the composition adjusting layer 3 cannot be used to limit the protection scope of the present invention.

It should be understood that the substrate 1 may be directly obtained or obtained through a preparation process, and those skilled in the art may selectively obtain directly or prepare a suitable substrate 1 according to the needs of the specific application scenario. The obtaining manner of the substrate 1 cannot be used to limit the protection scope of the present invention.

According to the semiconductor structure prepared by the above method, by arranging at least one composition adjusting layer, in which the atomic percentage of the first element is decreased firstly and then increased, above the substrate, a stress filed with periodic changes in the stress direction is constructed in the epitaxial structure above the substrate, so that bending annihilation of dislocations can be realized to reduce dislocations in the epitaxial structure. At the same time, due to the gradual decrease of the atomic percentage of the first element with a smaller atomic number, a compressive stress, which can cause a deformation of bulging from the middle to the periphery, is induced; and since the thickness of the gradual decrease section is greater than the thickness of the gradual increase section, the compressive stress, which can cause a deformation of bulging from the middle to the periphery, is still induced in the whole composition adjusting layer. Thus the tensile stress, which can cause a deformation of sinking from the periphery to the middle, induced during a cooling process of the whole epitaxial structure can be effectively balanced by the compressive stress, so that the whole epitaxial structure is not easily cracked and warped.

It should be understood that the terms "first", "second" and "third" mentioned above are only used to distinguish different elements in order to explain the technical scheme of the present invention more clearly; at the same time, the marks $III^1$, $III^2$ and $V^1$ and the letters a, b, c, n, x and y are also only used to more clearly explain the technical scheme of the present invention, and the above terms, marks and letters are not intended to limit the protection scope of the present invention.

Those described above are merely preferred embodiments of the present invention, and are not used to limit the protection scope of the present invention. Any modification, equivalent substitution, improvement, etc., made within the spirit and principles of the present invention, shall be included in the protection scope of the present invention.

What is claimed is:

1. A semiconductor structure, comprising:
   a substrate; and
   at least one composition adjusting layer disposed above the substrate;
   wherein each of the at least one composition adjusting layer is made of a semiconductor compound, the semiconductor compound at least comprises a first element and a second element, and an atomic number of the first element is less than an atomic number of the second element;
   wherein in each of the at least one composition adjusting layer, along an epitaxial direction of the substrate, an atomic percentage of the first element in a compound composition is gradually decreased at first and then gradually increased, a total thickness of a gradual decrease section is greater than a total thickness of a gradual increase section, and the atomic percentage at the end of the gradual increase section is less than or equal to the atomic percentage at the beginning of the gradual decrease section.

2. The semiconductor structure according to claim 1, wherein the semiconductor compound is an IV-IV group compound, and the first element and the second element are two kinds of IV group elements respectively.

3. The semiconductor structure according to claim 2, wherein the semiconductor compound is a binary IV-IV group compound, and the first element and the second element are Si and Ge respectively.

4. The semiconductor structure according to claim 1, wherein the semiconductor compound further comprises: a third element;

wherein the semiconductor compound is an IV-IV group compound, and the first element, the second element and the third element are three kinds of IV group elements respectively;

or, the semiconductor compound is an III-V group compound, the first element and the second element are two kinds of III group elements respectively, and the third element is a V group element;

or, the semiconductor compound is an II-VI group compound, the first element and the second element are two kinds of II group elements respectively, and the third element is a VI group element.

5. The semiconductor structure according to claim 4, wherein the semiconductor compound is a ternary IV-IV group compound, and the first element, the second element and the third element are Si, Ge, and Sn respectively; or
   the semiconductor compound is a ternary III-V group compound, the first element and the second element are Al and Ga respectively, and the third element is N; or
   the semiconductor compound is a ternary II-VI group compound, the first element and the second element are Zn and Cd respectively, and the third element is Se.

6. The semiconductor structure according to claim 1, wherein in the at least one composition adjusting layer, an average content of the first element in a nth composition adjusting layer along the epitaxial direction of the substrate is greater than an average content of the first element in a (n+1)th composition adjusting layer.

7. The semiconductor structure according to claim 6, wherein the atomic percentage of the first element at the beginning of the gradual decrease section of the nth composition adjusting layer is greater than the atomic percentage of the first element at the beginning of the gradual decrease section of the (n+1)th composition adjusting layer.

8. The semiconductor structure according to claim 6, wherein a total thickness of the nth composition adjusting layer is less than a total thickness of the (n+1)th composition adjusting layer.

9. The semiconductor structure according to claim 1, wherein in the composition adjusting layer, changing of the atomic percentage of the first element in the compound composition further comprises at least one constant value section along the epitaxial direction of the substrate.

10. The semiconductor structure according to claim 9, wherein in a nth composition adjusting layer along the epitaxial direction of the substrate, the atomic percentage of the first element in the compound composition is gradually decreased from an initial value $x_{na}$ to $x_{nb}$ along the epitaxial direction of the substrate at first, then gradually increased to $x_{nc}$, and the at least one constant value section comprises at least one of the following: an $x_{na}$ constant value section, an $x_{nb}$ constant value section and an $x_{nc}$ constant value section.

11. The semiconductor structure according to claim 1, wherein the gradual decrease section comprises any one or any combination of following sub-sections: at least one decrease sub-section, at least one constant value sub-section and at least one increase sub-section; and/or
   the gradual increase section comprises any one or any combination of following sub-sections: at least one decrease sub-section, at least one constant value sub-section and at least one increase sub-section.

12. The semiconductor structure according to claim 1, wherein atomic percentages of the gradual decrease section and/or the gradual increase section are changed gradually in any one or any combination of following ways: a linear gradient, a curved gradient and a step gradient.

13. The semiconductor structure according to claim 1, further comprising: a nucleation layer disposed between the substrate and a first composition adjusting layer along the epitaxial direction.

14. The semiconductor structure according to claim 1, further comprising: a component action layer disposed over the at least one composition adjusting layer.

15. A method for manufacturing a semiconductor structure, comprising:
- preparing a substrate and preparing at least one composition adjusting layer on the substrate;
- wherein each of the at least one composition adjusting layer is made of a semiconductor compound, the semiconductor compound at least comprises a first element and a second element, and an atomic number of the first element is less than an atomic number of the second element;
- wherein in each of the at least one composition adjusting layer, along an epitaxial direction of the substrate, an atomic percentage of the first element in a compound composition is gradually decreased at first and then gradually increased, a total thickness of a gradual decrease section is greater than a total thickness of a gradual increase section, and the atomic percentage at the end of the gradual increase section is less than or equal to the atomic percentage at the beginning of the gradual decrease section.

* * * * *